United States Patent [19]
Bailey et al.

[11] Patent Number: 5,281,931
[45] Date of Patent: Jan. 25, 1994

[54] ON-CHIP SELF-TUNING FILTER SYSTEM

[75] Inventors: James A. Bailey; Paul H. Francois, both of Tucson, Ariz.

[73] Assignee: International Business Machines Corporation, Armonk, N.Y.

[21] Appl. No.: 957,853

[22] Filed: Oct. 8, 1992

[51] Int. Cl.$^5$ .................... H03G 11/04; H04B 3/04
[52] U.S. Cl. .................. 333/17.1; 455/125; 333/174; 307/521
[58] Field of Search ............ 333/17, 174, 16; 307/521

[56] References Cited

U.S. PATENT DOCUMENTS

| | | | |
|---|---|---|---|
| 3,978,420 | 8/1976 | Lane | 330/107 |
| 4,451,792 | 5/1984 | Gay | 329/145 |
| 4,726,071 | 2/1988 | Jachowski | 455/125 |
| 4,733,205 | 3/1988 | Hughes | 333/172 |
| 4,801,888 | 1/1989 | Hague | 330/9 |
| 5,063,309 | 11/1991 | Yamasari | 307/521 |
| 5,072,298 | 12/1991 | Sumiyoshi | 358/158 |

FOREIGN PATENT DOCUMENTS 0095416 6/1983 Japan .

Primary Examiner—Robert J. Pascal
Assistant Examiner—Darius Gambino
Attorney, Agent, or Firm—D. A. Shifrin

[57] ABSTRACT

An on-chip apparatus and method are provided for automatically tuning a continuous time filter in which a single filter selectively filters an information signal or, when tuning is desired, an unfiltered reference signal. During tuning, a controller determines the amplitudes of the unfiltered and filtered reference signals and their ratio. From the ratio, the controller ascertains a corresponding center or tuned frequency of the filter. If the ascertained frequency does not substantially equal a desired tuned frequency, the controller directs a bias controller to adjust the bias of the filter until the tuned frequency is substantially equal to the desired tuned frequency.

31 Claims, 2 Drawing Sheets

ON-CHIP SELF-TUNING FILTER SYSTEM

TECHNICAL FIELD OF THE INVENTION

This invention relates to filters and, in particular, to an on-chip method and apparatus for automatically tuning a continuous time filter.

BACKGROUND OF THE INVENTION

The accuracy of a continuous time filter depends, in part, upon the tolerances of its components. For example, there is a practical limit to the precision to which integrated components (e.g., resistors, capacitors and transistors) can be fabricated. Fabrication process variances may prevent two components within a single filter from having the same specified value.

Consequently, two filters, sharing a common specification, may not perform identically and may have different center or tuned frequencies. Additionally, component values (and, therefore, the tuned frequency) may change during operation of a filter due to temperature fluctuations and aging. Finally, there may be circumstances in which it is desirable to intentionally alter the tuned frequency.

Briefly, tuning a filter can be accomplished by adjusting the characteristics of the filter's capacitors or transistors by means of a tuning bias. If automatic tuning is desired, such as to offset the effects of temperature variations and aging, feedback circuitry is employed. A phase locked loop (PII.) is commonly used in such circuitry with either a voltage controlled oscillator (VCO) or a voltage controlled filter (VCF). These circuits detect the phase difference between a reference clock signal with a predetermined frequency and a reference signal filtered by a reference filter having the same nominal specifications as the operational filter. The phase difference is minimized by altering the tuning bias of the reference filter. Similar adjustments are also made to the tuning bias of the operational filter under the assumption that variations (such as those which are due to temperature or aging) in the operational filter will also be present in the reference filter, and to the same extent.

For the basic assumption to be valid, the two filters should be precisely matched and in close physical proximity to each other. However, due to the varied fabrication process and other variances which an automatic tuning technique is designed to overcome, such precision is expensive and difficult to achieve, especially at high frequencies. Additionally, the reference clock frequency should be outside the pass band of the filter to reduce adverse coupling of the reference clock signal (and any noise associated with it) with the signal being filtered.

A switched capacitor tuning technique has also been proposed for altering the characteristics of a filter which relies upon the frequency dependency of a switched capacitor resistor. A clock signal controls a set of switches (such as MOS transistor switches) which permit the capacitor to charge and discharge at the clock frequency rate. Changing the clock frequency changes the effective resistance of the capacitor, thereby tuning the filter. Such a circuit requires a high frequency clock or a very large capacitor, which may not be able to be implemented in integrated form.

It should be particularly noted that circuits incorporating these techniques, which employ a reference signal and in which the tuning occurs while the filter is in operation, should include means to prevent noise from the reference signal from passing into the biasing signal and into the information signal itself.

Because complete filtering of such noise may not be possible, the performance of the filter can be adversely affected.

SUMMARY OF THE INVENTION

In accordance with the present invention, an apparatus and method are provided for tuning a continuous-time filter to automatically compensate for component value deviations which can occur during fabrication or which may be due to aging, temperature changes or other factors. In particular, the present invention takes advantage of a relationship between the center or tuned frequency of a filter and the amplitude of a filtered signal. Thus, for a given filtered signal amplitude, there is a corresponding tuned frequency of the filter changes in the amplitude indicate changes in the frequency. The present invention also disables the reference signal when the self-tuning feature is not activated and disables the information signal when the selftuning feature is activated, thus eliminating the risk of noise from the reference signal interfering with the information signal.

More specifically, the apparatus of the present invention comprises means for selecting between an information signal and an unfiltered reference signal; a tunable filter for filtering the information signal or the unfiltered reference signal and for generating a filtered information signal or a filtered reference signal; a controller, responsive to the unfiltered and filtered reference signals, for ascertaining the tuned frequency of the filter and for generating a control signal representative of a difference between a desired tuned frequency of the filter and the ascertained tuned frequency; and means, responsive to the controller, for adjusting the tuned frequency of the filter. Preferably, the controller comprises means for determining the amplitude of the unfiltered and filtered reference signals and determining their ratio, means for ascertaining a tuned frequency of the filter corresponding with the determined ratio, and means for comparing the ascertained tuned frequency with a desired tuned frequency.

The method of the present invention comprises the steps of processing an unfiltered reference signal in a tunable filter to generate a filtered reference signal determining the amplitudes of the unfiltered and filtered reference signals and their ratio; determining the tuned frequency of the filter from the ratio; adjusting the tuning bias of the filter until the tuned frequency of the filter is substantially equal to a desired frequency; and processing an information signal in the filter.

The present invention can be implemented on the same chip as the filter itself and processes both the information signal and the reference signal through the same filter but uncouples the reference signal when the information signal is being processed. Additionally, if desired, external signals to the controller can change the desired tuned frequency (for example, to re-shape the spectrum of the information signal), thereby initiating biasing changes in the filter.

The foregoing and other features and advantages of the invention will be apparent from the following more particular description of preferred embodiments of the invention, as illustrated in the accompanying drawings.

DETAILED DESCRIPTION

Figure 1:
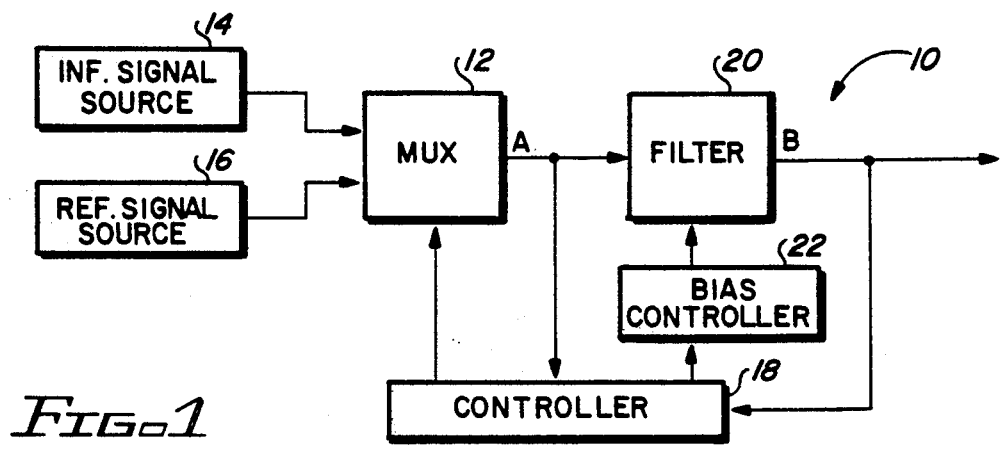
FIG. 1 is a block diagram of an embodiment of a selftuning filter system of the present invention.

FIG. 1 illustrates a block diagram of an embodiment of a self-tuning filter system 10 of the present invention. A selector 12, such as a multiplexer (MUX), has one input interconnected with an information signal source 14, such as magnetic tape head circuitry, and another input interconnected with a reference signal source 16. The input selection by the selector 12 is directed by a controller 18. The controller 18 can comprise a dedicated microprocessor or other programmable controller, or can be incorporated into a non-dedicated processor performing other tasks. A continuous time filter 20 receives and processes the selected signal from the selector 12 and outputs a filtered information signal or a filtered reference signal, determined by the selector 12. The input and the output of the filter 20 are interconnected with inputs of the controller 18 which analyzes both the unfiltered reference signal and the filtered reference signal, referred to in FIGS. 1 and 2 as A and B, respectively, to determine whether the tuned frequency of the filter 20 is substantially equal to a desired tuned frequency. An output of the controller 18 is interconnected with an input of a biasing controller 22; control signals direct the biasing controller 22 to adjust the bias of the filter 20 until its tuned frequency is substantially equal to the desired tuned frequency.

Figure 2:
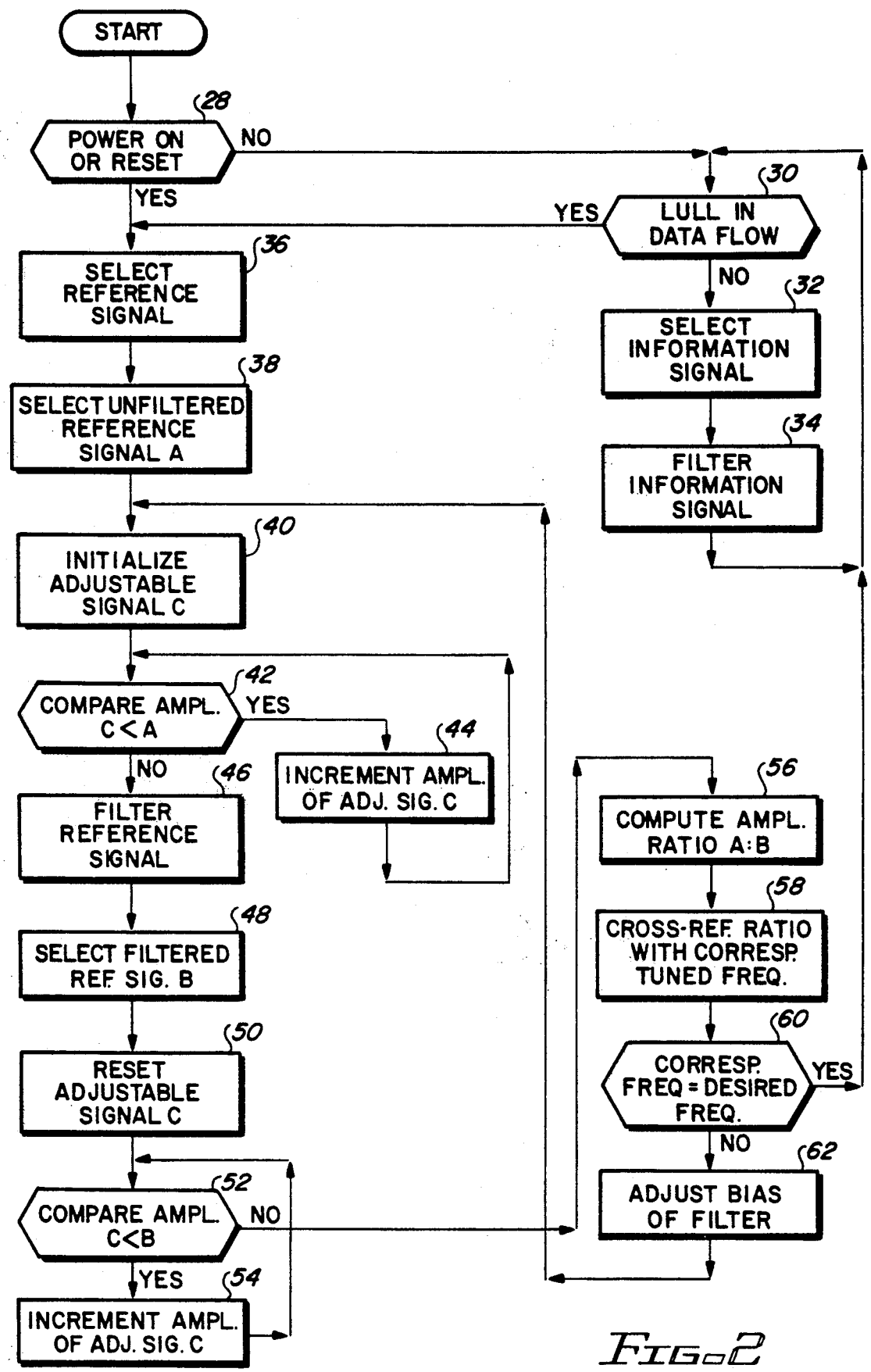
FIG. 2 is a flow chart of a method for automatically tuning a filter.

The operation of the self-tuning filter system 10 of the present invention will be now described with reference to the block diagram of FIG. 1 and the flow chart of FIG. 2. When the information signal source is selected by the selector 12, the information signal, containing data, is filtered by the filter 20. Periodically, however, there is a lull in the data being transmitted by the information signal source 14 and the system 10 takes advantage of the lull to automatically activate the self-tuning feature. The self-tuning feature is also activated during system power-on and reset in step 28. If system 10 determines in step 30 that there is no lull in the data flow, selection of the information signal source is retained or made in step 32 and the information signal is filtered in step 34. When there is a lull, or upon power-on and reset in step 28, selection of the reference signal source 14 is made in step 36 and the reference signal filtered in step 38.

The actual tuned frequency of the filter, which, due to fabrication, aging and temperature variations, may not be the desired tuned frequency, is then determined. Because the frequency and amplitude of the reference signal may not remain constant, the ratio of the amplitudes of the unfiltered and filtered reference signals A and B are calculated and compared with a corresponding tuned frequency. Therefore, the controller 18 selects the unfiltered input signal A in step 38 and initializes an adjustable signal in step 40 (referred to as C in FIG. 2) to an initial amplitude. The amplitude of the adjustable signal C is compared in step 42 to the amplitude of the unfiltered reference signal A. If the amplitude of the unfiltered reference signal A is greater than the amplitude of the adjustable signal C, the amplitude of the adjustable signal C is increased in step 44 by a fixed amount and the two amplitudes again compared in step 42. The process repeats until the amplitude of the adjustable signal C becomes equal to or slightly greater than the amplitude of the unfiltered reference signal A, thereby providing a close indication of the amplitude of the unfiltered reference signal A.

When the controller 18 selects the reference signal in step 36, the reference signal is filtered in step 46 to generate the filtered reference signal B. After the amplitude of the unfiltered reference signal A has been determined in steps 40 through 44, the controller deselects the unfiltered reference signal A and selects the filtered reference signal B in step 48 for processing. The amplitude of the adjustable signal C is reset to an initial amplitude in step 50 and compared with the amplitude of the filtered reference signal B in step 52. If the amplitude of the filtered reference signal B is greater than the amplitude of the adjustable signal C, the amplitude of the adjustable signal C is increased in step 54 by a fixed amount and the two amplitudes again compared in step 52. The process repeats until the amplitude of the adjustable signal C is slightly greater then the amplitude of the filtered reference signal B, thereby providing a close indication of the amplitude of the filtered reference signal B.

It will be appreciated, of course, that other methods can be employed to determine the amplitudes of the unfiltered and filtered reference signals A and B, such as directly by using an A/D converter. It will also be appreciated that the amplitude of the filtered reference signal B could be determined before the amplitude of the unfiltered reference signal A.

Next, the ratio of the amplitudes of the two filtered signals A and B is computed in step 56. This ratio has been found to be related to the tuned frequency of the filter 20. The relationship ca be calculated and the results programmed into the system controller 18, such as with a "look-up table" correlating ratios with corresponding frequencies. Thus, given a computed ratio, the corresponding tuned frequency of the filter 20 can be ascertained in step 58.

After the actual tuned frequency of the filter 20 has been ascertained, it is compared in step 60 with the desired frequency of the filter 20, previously programmed into the controller 18. If the two are substantially equal (that is, if the actual tuned frequency is within an allowable tolerance of the desired frequency), then the system 10 returns to the beginning in step 30 of the process. Otherwise, the bias of the filter 20 is adjusted in step 62 and the process, beginning with step 40, repeats until the actual tuned frequency is within the allowable tolerance of the desired frequency.

Figure 3:
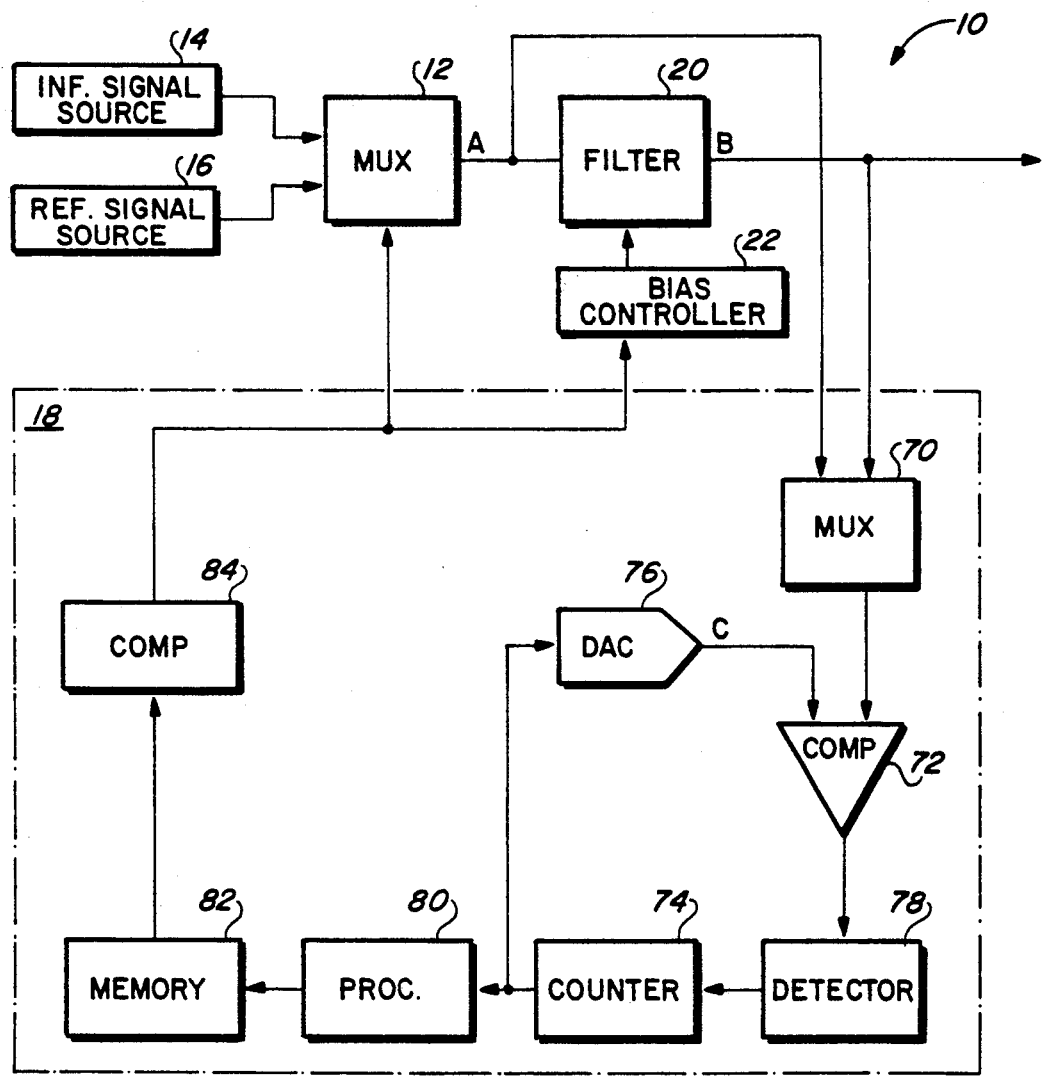
FIG. 3 is a block diagram of an embodiment of a controller for the self-tuning filter system of the present invention.

FIG. 3 illustrates a block diagram of an embodiment of the controller 18 of the self-tuned filter system 10. Both the signal input and output of the filter 20, carrying the unfiltered and filtered reference signals A and B, respectively, are interconnected with inputs of a selector 70, such as a MUX. The output of the selector 70 is interconnected with an input of a comparator 72. A counter 74 has an output interconnected with an input of a digital-to-analog converter (DAC) 76 or other means to generate the adjustable signal C. The output of the DAC 76 is interconnected with a second input of the comparator 72. The output of the comparator 72 is interconnected with an input of an indicator 78, which can include a flip-flop, to detect transitions in the state of the output of the comparator 72. The output of the indicator 78 is, in turn, interconnected with an input of the counter 74. The output of the counter 74 is also interconnected with a processor 80 for determining the ratio of the amplitudes of the unfiltered and filtered reference signals A and B, having an output interconnected with an input of a memory device 82 having, for example, a look-up table. The memory device 82 has an output interconnected with an input of a comparing means 84. The output of the comparing means 84 is interconnected with the input of the biasing controller 22.

In operation, if the amplitude of the adjustable signal C is less than the amplitude of the selected reference signal A or B (as determined by the state of the comparator 72), the controller 18 directs the counter 74 to increment, thereby increasing the amplitude of the output of the DAC 76 (i.e., the adjustable signal C) by a fixed amount. When the amplitude of the adjustable signal C becomes greater than the amplitude of the selected reference signal A or B, the indicator 78 detects the change in state of the output of the comparator 72 to indicate that the peak amplitude of the selected reference signal A or B has been found.

After the amplitudes of the unfiltered and filtered reference signals A and B have been determined, their ratio is computed and sent to the memory device 82. The frequency of the filter 20 corresponding to the ratio is read from the look-up table in the memory device 82 and the comparing means 84 determines whether the frequency is substantially equal to the tuned frequency at which it is desired that the filter 20 operate. If so, the bias of the filter 20 remains unchanged; if not, the controller 18 directs the biasing controller 22 to adjust the tuning bias of the filter 20. If the filter 20 is responsive to analog control signals, the biasing controller 22 can be a DAC to convert the digital output from the controller 18 into an analog control signal. If the filter 20 is responsive to digital control signals, the biasing controller 22 can be a digital register to store and transmit an appropriate digital control signal. Either a DAC or a register can be interconnected with the comparing means 84 to load an appropriate value for incrementing the bias control output.

It will be understood that the functions of many of the elements of the controller 18 can be implemented as discrete hardware components or can be implemented in a programmable controller.

The foregoing process repeats until the actual tuned frequency of the filter 20 is substantially equal to the desired frequency. Then, the controller 18 directs the selector 12 to deselect the reference signal source 16 and select the information signal source 14 as the input to the filter 20, thus removing the reference signal source 16, and any associated noise, from the filter system. To further isolate the information signal from the reference signal, the reference signal source 16 can be shut off completely.

Because the information signal and the reference signal are both processed by a single filter, the present invention can automatically compensate for fabrication process variations, temperature changes and aging without separate and precisely matched filter circuits. It can also accommodate planned changes to the filter's frequency and can be efficiently implemented on the same chip as the filter. Furthermore, the self-tuning feature of the present invention, being enabled whenever there is a lull in the data flow from the information signal source, does not interrupt the data flow, and, being disabled when tuning is complete, does not introduce significant noise into the information signal.

While the invention has been particularly shown and described with reference to preferred embodiments thereof, it will be understood by those skilled in the art that various changes in form and details may be made therein without departing from the spirit and scope of the invention.

What is claimed is:

1. A self-tuning filter system, comprising:
   first switching means for selecting between a reference signal source, providing an unfiltered reference signal, and an information signal source;
   a tunable filtering stage, having an input coupled to said first switching means, for generating a selected one of a filtered reference signal and a filtered information signal;
   means for generating an adjustable signal having an adjustable amplitude;
   first comparing means for selectively comparing the amplitude of the adjustable reference signal with the amplitude of the unfiltered and filtered reference signals;
   first determining means, having an input interconnected with an output of said first comparing means and an output interconnected with said means for generating, for determining when the amplitude of the adjustable signal exceeds the amplitude of the selected reference signal;
   means, responsive to said first determining means, for computing the ratio of the amplitudes of the unfiltered and filtered reference signals;
   second determining means for determining the tuned frequency of said filtering stage corresponding with the computed ratio;
   second comparing means for comparing the corresponding tuned frequency with a desired tuned frequency; and
   biasing means, responsive to said second comparing means, for adjusting the tuning bias of said filtering stage until the corresponding tuned frequency is substantially equal to the desired tuned frequency.

2. A self-tuning filter system as claimed in claim 1, wherein said means for generating the adjustable signal comprises:
   a counter responsive to said first determining means; and
   a digital-to-analog converter responsive to said counter.

3. A self-tuning filter system as claimed in claim 1, wherein said means for computing the ratio comprises a processor.

4. A self-tuning filter system as claimed in claim 1, wherein said second determining means comprises a memory means.

5. A self-tuning filter system as claimed in claim 4, wherein said memory means includes a look-up table.

6. A self-tuning filter system as claimed in claim 1, wherein said biasing means comprises a digital-to-analog converter.

7. A self-tuning filter system as claimed in claim 1, wherein said biasing means comprises a digital register.

8. A self-tuning filter system as claimed in claim 1, wherein said first switching means comprises a multiplexer.

9. A self-tuning filter system as claimed in claim 1, further comprising second switching means, having an output interconnected with said first comparing means, for selecting between the unfiltered reference signal and the filtered reference signal.

10. A self-tuning filter system as claimed in claim 9, wherein said second switching means comprises a multiplexer.

11. A method for automatically tuning a filter, comprising the steps of:
   determining the amplitude of an unfiltered reference signal;
   processing the unfiltered reference signal in a tunable filter to generate a filtered reference signal having an amplitude;
   determining the amplitude of the filtered reference signal;
   determining the ratio of the amplitude of the unfiltered reference signal to the amplitude of the filtered reference signal;
   determining the tuned frequency of the filter from the determined ratio;
   adjusting the tuning bias of the filter until the tuned frequency of the filter is substantially equal to a desired frequency; and
   processing an information signal in the filter.

12. A method as claimed in claim 11, wherein said step of determining the amplitude of the filtered reference signal comprises the steps of:
   generating an adjustable signal having an adjustable amplitude;
   comparing the amplitude of the filtered reference signal with the amplitude of the second reference signal; and
   increasing the amplitude of the adjustable signal until the amplitude of the adjustable signal is greater than the amplitude of the filtered reference signal.

13. A method as claimed in claim 12, wherein said step of generating the adjustable signal comprises the step of converting a predetermined digital signal into a corresponding analog signal.

14. A method as claimed in claim 12, wherein said step of increasing the amplitude of the adjustable signal comprises the step of incrementing the output of a digital-to-analog converter.

15. A method as claimed in claim 12, wherein said step of determining the amplitude of the unfiltered reference signal comprises the steps of:
   generating an adjustable signal having an adjustable amplitude;
   comparing the amplitude of the unfiltered reference signal with the amplitude of the adjustable signal; and
   increasing the amplitude of the adjustable signal until the amplitude of the adjustable signal is greater than the amplitude of the unfiltered reference signal.

16. A method as claimed in claim 15, wherein said step of determining the tuned frequency of the filter comprises the steps of:
   looking up the ratio of the amplitude of the unfiltered reference signal to the amplitude of the filtered reference signal; and
   looking up the tuned frequency corresponding with the ratio.

17. A method as claimed in claim 11, wherein said step of adjusting the tuning bias of the filter comprises the steps of:
   comparing the determined tuned frequency with a desired frequency; and
   directing a bias controller to adjust the bias of the filter.

18. A method as claimed in claim 11, wherein said step of processing the unfiltered reference signal comprises the step of switching a filter input from the information signal to the unfiltered reference signal when the information signal is unneeded.

19. A method as claimed in claim 11, wherein said step of processing the information signal comprises the step of switching a filter input from the unfiltered reference signal to the information signal after the filter has been tuned.

20. A self-tuning filter system, comprising:
   first switching means for selecting between an information signal and an unfiltered reference signal;
   a tunable filtering stage, interconnected with said first switching means, for receiving a selected one of the information signal and the unfiltered reference signal and for generating a selected one of a filtered information signal and a filtered first reference signal;
   control means, responsive to the unfiltered and filtered reference signals, for ascertaining the tuned frequency of the filtering stage and for generating a control signal representative of a difference between a desired tuned frequency of the filtering stage and the ascertained tuned frequency; and
   means, responsive to the control signal, for adjusting the tuned frequency of the filtering stage.

21. A self-tuning filter system as claimed in claim 20, wherein said control means comprises:
   means for determining the amplitude of the unfiltered reference signal;
   means for determining the amplitude of the filtered reference signal; and
   means for computing the ratio of the amplitude of unfiltered reference signal to the amplitude of the filtered reference signal.

22. A self-tuning filter system as claimed in claim 21, wherein said control means further comprises:
   means for ascertaining the tuned frequency of the filtering stage from the determined ratio; and
   means for comparing the ascertained tuned frequency with the desired tuned frequency.

23. A self-tuning filter system as claimed in claim 22, wherein said means for ascertaining the tuned frequency of the filtering stage comprises a memory means having a look-up table.

24. A self-tuning filter system as claimed in claim 21, wherein said means for computing the ratio comprises a processor.

25. A self-tuning filter system as claimed in claim 21, wherein said means for determining the amplitude of the filtered reference signal comprises:
   means for initializing an adjustable signal to a first amplitude;
   means for comparing the first amplitude of the adjustable signal with the amplitude of the filtered reference signal; and
   means for adjusting the amplitude of the adjustable signal until the amplitude of the adjustable signal exceeds the amplitude of the filtered reference signal.

26. A self-tuning filter system as claimed in claim 25, wherein said means for initializing and adjusting the amplitude of the adjustable signal comprises a digital-toanalog converter responsive to said means for comparing the first amplitude, wherein, in operation, said means for comparing the first amplitude directs said digital-to-analog converter to increase the amplitude of the adjustable signal until the amplitude of the adjustable signal exceeds the amplitude of the filtered reference signal.

27. A self-tuning filter system as claimed in claim 21, wherein said means for determining the amplitude of the unfiltered reference signal comprises:
  means for initializing an adjustable signal to a first amplitude;
  means for comparing the first amplitude of the adjustable signal with the amplitude of the unfiltered reference signal; and
  means for adjusting the amplitude of the adjustable signal until the amplitude of the adjustable signal exceeds the amplitude of the unfiltered reference signal.

28. A self-tuning filter system as claimed in claim 20, wherein said means for adjusting the tuned frequency of the filtering stage comprises means for adjusting the tuning bias of the filtering stage.

29. A self-tuning filter system as claimed in claim 28, wherein said means for adjusting the tuning bias of the filtering stage comprises a digital-to-analog converter.

30. A self-tuning filter system as claimed in claim 28, wherein said means for adjusting the tuning bias of the filtering stage comprises a digital register.

31. A self-tuning filter system as claimed in claim 20, wherein said first switching means comprises a multiplexer.

* * * * *